US008713487B2

(12) United States Patent
Word et al.

(10) Patent No.: US 8,713,487 B2
(45) Date of Patent: *Apr. 29, 2014

(54) SUB-RESOLUTION ASSIST FEATURE REPAIR

(71) Applicant: Mentor Graphics Corporation, Wilsonville, OR (US)

(72) Inventors: James Word, Portland, OR (US); Kyohei Sakajiri, Portland, OR (US)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 13/737,363

(22) Filed: Jan. 9, 2013

(65) Prior Publication Data

US 2013/0191792 A1  Jul. 25, 2013

Related U.S. Application Data

(63) Continuation-in-part of application No. 13/085,096, filed on Apr. 12, 2011, now abandoned, which is a continuation of application No. 12/039,720, filed on Feb. 28, 2008, now Pat. No. 7,926,002.

(60) Provisional application No. 60/904,341, filed on Feb. 28, 2007, provisional application No. 60/973,091, filed on Sep. 17, 2007.

(51) Int. Cl.
*G06F 17/50* (2006.01)

(52) U.S. Cl.
USPC .................................. 716/53; 716/54

(58) Field of Classification Search
USPC ........................................ 716/50–55
See application file for complete search history.

(56) References Cited

U.S. PATENT DOCUMENTS

| 7,926,002 B2 * | 4/2011 | Word et al. ............ 716/50 |
| 2002/0155357 A1 * | 10/2002 | LaCour ............ 430/5 |
| 2006/0236271 A1 * | 10/2006 | Zach ............ 716/1 |

* cited by examiner

*Primary Examiner* — Binh Tat

(57) ABSTRACT

After layout design data has been modified using a resolution enhancement process, a repair flow is initiated. This repair flow includes checking a layout design altered by a resolution enhancement process for errors. A repair process is performed to correct detected sub-resolution assist feature errors. The repair process may employ a rule-based sub-resolution assist feature technique, a model-based sub-resolution assist feature technique, an inverse lithography-based sub-resolution assist feature technique, or any combination thereof.

10 Claims, 8 Drawing Sheets

Flow chart 1100

SUB-RESOLUTION ASSIST FEATURE REPAIR

RELATED APPLICATIONS

This application is a continuation-in-part of U.S. application Ser. No. 13/085,096, entitled "Selective Optical Proximity Layout Design Data Correction," filed on Apr. 12, 2011, which is a continuation of U.S. application Ser. No. 12/039,720, filed on Feb. 28, 2008, now U.S. Pat. No. 7,926,002 which claims the benefit of U.S. Provisional Patent Application No. 60/904,341 entitled "Optical Proximity Mask Shape Repair," filed on Feb. 28, 2007, and of U.S. Provisional Patent Application No. 60/973,091 entitled "Automatic OPC Repair Flow: Optimized Implementation of the Repair Recipe," filed on Sep. 17, 2007. All of the previous-filed applications are incorporated entirely herein by reference.

FIELD OF THE INVENTION

The present invention relates to resolution enhancement technologies. Various implementations of the invention may be useful for selectively modifying layout design data used to create a mask.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design is again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components (e.g., contacts, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks. After the design is finalized, the design can be used by fabricated to manufacturer the device.

There are many different fabrication processes for manufacturing a circuit, but most processes include a series of steps which deposit layers of different materials on a substrate, expose specific portions of each layer to radiation, and etch the exposed (or non-exposed) portions of the layer away. For example, a simple semiconductor circuit could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, causing the exposed areas to be etched away, leaving behind exposed areas on the epitaxial layer, (i.e., areas no longer covered by the nitride layer). Specific shapes or patterns on these exposed areas then are subjected to a diffusion or ion implantation process. This causes dopants, (for example, phosphorus) to enter the exposed epitaxial layer and form negative wells. This process of depositing layers of material on the substrate or subsequent material layers, and then exposing specific patterns to radiation, dopants or other diffusion processes, is repeated a number of times. This series of steps allows the different physical layers of the circuit to be manufactured, forming gates, connecting layers, polysilicon layers, and eventually transistors on the substrate. The combination of these components make up what is often referred to as an integrated circuit device.

Each time that a layer is exposed to radiation or diffusion, a mask must be created to expose certain areas to the radiation or diffusion and protect the other areas from exposure. Each mask is created from circuit layout data. For each layer of material in the circuit that is masked and etched, corresponding layout design data must be used to create the mask. The geometric elements described in layout design data define the relative locations or areas of the circuit device that will be exposed to radiation or diffusion. A mask or reticle writing tool is used to create the mask or reticle based upon the layout design data, after which the mask can be used in a photolithographic process. This process of transferring the design from the mask to the substrate is often referred to as "printing" or "etching" the design.

As designers and manufacturers continue to increase the number of circuit components in a given area and/or shrink the size of circuit components, the shapes reproduced on the substrate (and thus the shapes in the mask) become smaller and closer together. This reduction in feature size increases the difficulty of faithfully reproducing the image intended by the layout design to the mask and onto the substrate. This difficulty often results in defects where the intended image is not accurately "printed" onto the substrate, creating flaws in the manufactured device. Accordingly, the terms "error" or "potential print error" are used herein to refer to a feature or group of features in layout design data that may not be accurately printed onto a substrate during a lithographic manufacturing process.

To address this problem, one or more resolution enhancement techniques are often employed. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, *Proceedings of SPIE Vol.* 5377, which article is incorporated entirely herein by reference. One of these techniques, radiation amplitude control, is often facilitated by modifying the layout design data employed to create the lithographic mask. One way to implement this technique, for example, is to adjust the edges of the geometric elements in the layout design so that the mask created from the modified layout data will control the radiation amplitude in a desired way during a lithographic process. The process of modifying the layout design data in this manner is often referred to as "optical proximity correction" or "optical process correction" (OPC).

As previously noted, a layout design is made up of a variety of geometric elements. In a conventional OPC process, the edges of the geometric elements (which are typically polygons) are fragmented, and the edge fragments are rearranged to reflect the desired modifications. For example, some OPC processes will reconfigure the edge fragments of a polygon to create serifs at one or more corners. The edge fragments are typically reconfigured according to one or more parameters, such as the size and spacing limitations on the edge fragments, or polygon placement. The values selected for these parameters have a significant impact on how and to what extent that the edge fragments within the layout data are modified during the OPC process. The set of parameter values used for an OPC process are often referred to as the "OPC recipe".

Another way to implement the OPC technique involves adding geometric elements (sub-resolution assist features, or SRAFs) in the layout design. This approach is sometimes simply referred to as SRAF. While the conventional OPC approach certainly corrects many proximity effects, it does not address one proximity effect—variations in focus condition. The variations in focus condition become significant when an off-axis illumination scheme (one of the three major resolution enhancement technologies) is optimized for greatest depth of focus of densely placed features. SRAFs are designed to reduce the difference by making a relatively isolated main feature behave lithographically more like a densely-placed main feature. For example, scattering bars, a common type of SRAFs, may be placed adjacent to relatively isolated lines (main features), allowing the isolated lines to diffract light like dense lines. Here, a main feature is referred to as a feature that is intended to print.

An SRAF, as the name implies, is a sub-resolution feature that is not meant to print. It must be carefully adjusted in size and position so that it never prints over the needed process window. This determines the most important trade-off in SRAF generation and placement: making the assist features as large and dense as possible in order to create a more dense-like mask pattern, but not so large or dense that they print. Just like the conventional OPC approach, there are rule-based SRAF and model-based SRAF methods. The rule-based SRAF methods are quite common, but have difficulty with 2D placement. For example, there is a problem of what to do with contact or via features. The model-based SRAF methods show promise for complex 2D geometries, but are difficult to implement. The rule-based SRAF methods and the model-based SRAF methods can also be combined to take advantage of both the simplicity of the former and the high quality of the latter.

Once a layout design is finalized, it must be examined to ensure that the design does not have potential print errors (i.e., design features that may not be correctly printed during a lithograph process). If there are potential print errors, then these potential print errors must be corrected. For example, if the design includes only a few potential print errors, then a designer may either manually correct these errors. Alternately, a designer may employ an OPC process with a new recipe on the design to solve the problem. Some of these potential print errors may be due to missing or misplaced SRAFs. These errors should also be addressed during the repair process.

While performing OPC on layout design data can improve the fidelity of the lithographic process, OPC can be expensive in terms of both computing resources and processing time. Layout designs can be very large, and even one layout data file for a single layer of a field programmable gate array may be approximately 58 gigabytes. Accordingly, performing even a single OPC process on a design is computationally intensive. Repeating an OPC process to correct remaining potential print errors then only adds to time required to finalize the layout design. On the other hand, manually correcting potential print errors is very time consuming as well.

BRIEF SUMMARY OF THE INVENTION

Aspects of the invention relate to techniques for repairing sub-resolution assist features after layout data have been processed by resolution enhancement techniques. In various embodiments of the invention, a layout design altered by a resolution enhancement process is checked for errors. One or more errors are detected and comprise one or more sub-resolution assist feature errors. The one or more sub-resolution assist feature errors may comprise missing sub-resolution assist features and incorrectly placed sub-resolution assist features. A repair process is performed to correct the one or more detected sub-resolution assist feature errors. The repair process may employ a rule-based sub-resolution assist feature technique, a model-based sub-resolution assist feature technique, an inverse lithography-based sub-resolution assist feature technique, or any combination thereof.

According to some implementations of the invention, if the one or more errors comprise main feature errors, an OPC repair flow is initiated. This repair flow includes forming regions around the identified potential print errors, and an OPC process is performed only on the data within these regions. In further examples of the invention, this repair flow is iteratively repeated, where a different set of process parameter values during each iteration. These different sets of process parameter values may also differ from the set used in the resolution enhancement process.

These and other features and aspects of the invention will be apparent upon consideration of the following detailed description.

DETAILED DESCRIPTION OF THE INVENTION

Figure 1:
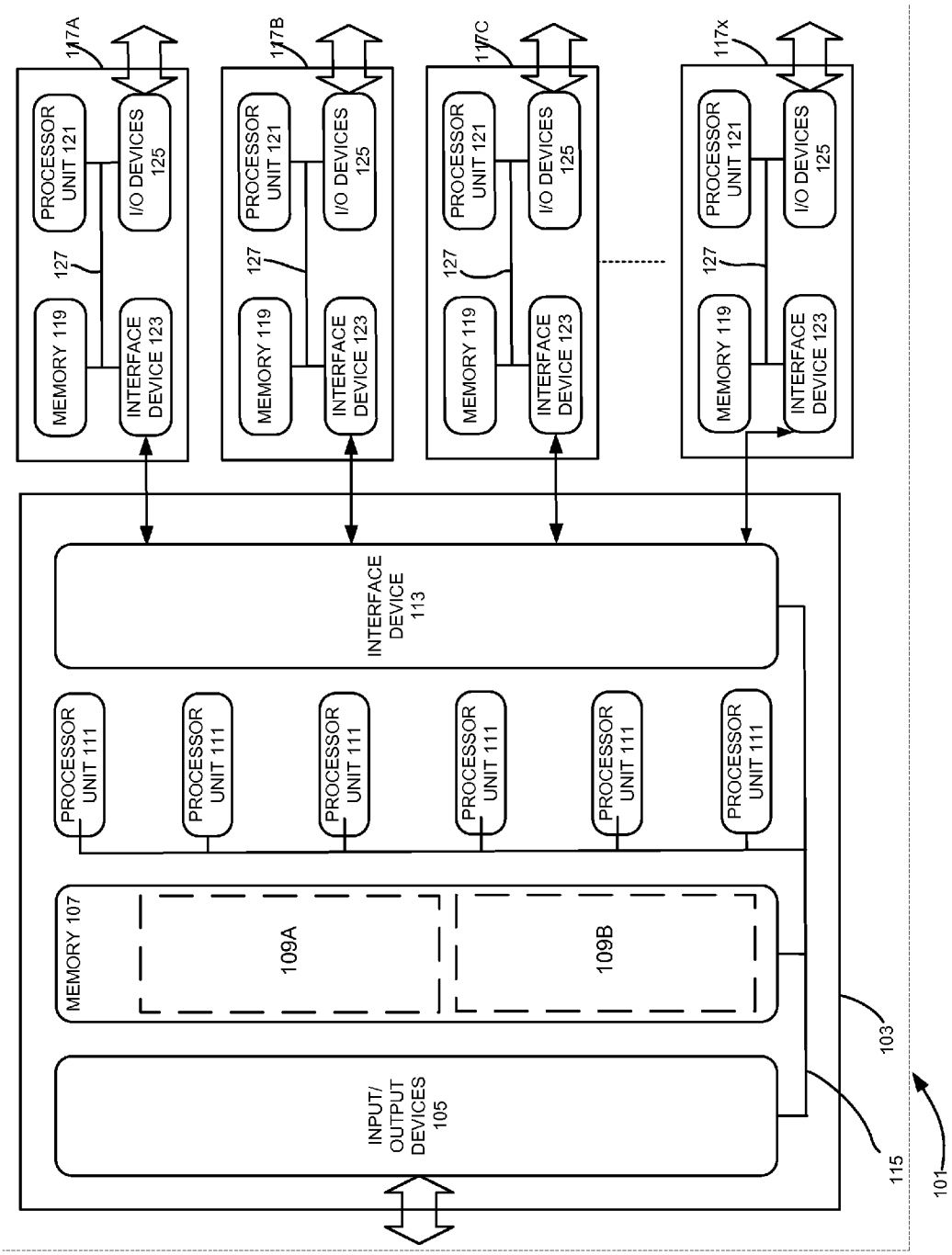
FIG. 1 illustrates an example of a computing system that may be used to implement various embodiments of the invention.

Various aspects of the present invention relate to repairing sub-resolution assist features. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "perform," "form" and "check" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

In this disclosure, the terms "subcircuit" and "memory-circuit device groups" are used in a broad sense.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
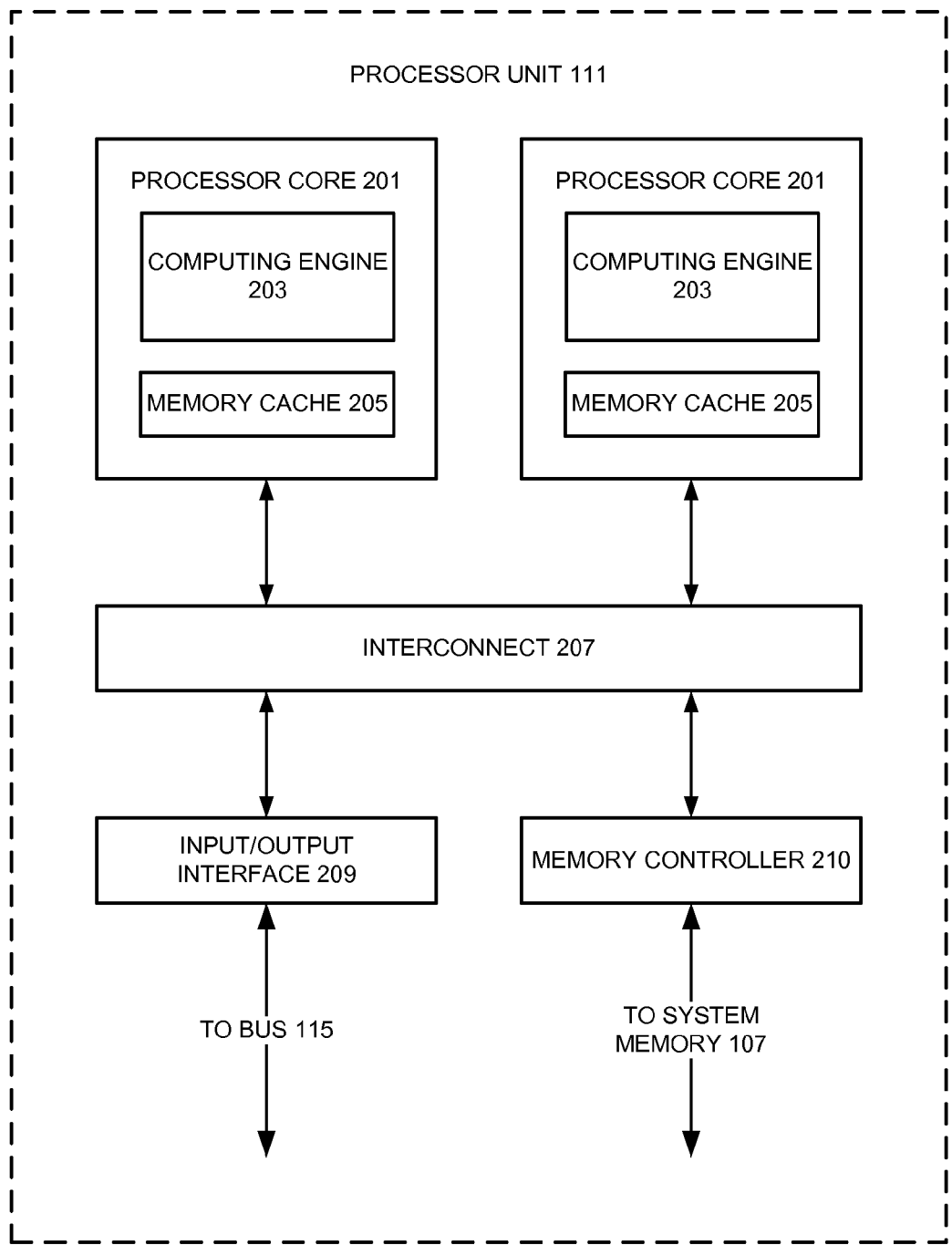
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Common Causes of Potential Print Errors

As discussed in detail above, OPC typically is performed on layout design data to improve the reproducibility of the design image during a lithographic manufacturing process. As also previously noted, even after an OPC process is performed, the layout design data may still include various potential print errors. One cause of such potential print errors is the non-convergence of edges during an OPC process. In this situation, one of the edges in a design has failed to completely realize the objective function of the OPC algorithm. Because OPC corrections typically are iterative (i.e., the lithographic process is simulated, an edge is moved, and the lithographic process is simulated again), insufficient iterations can result in non-converged edges. This is most commonly seen either in low-mask error enhancement factor (MEEF) areas, (i.e., areas where edge movements have limited impact on simulated edge placement), or in high-MEEF areas, (i.e., areas where oscillations can typically occur).

Figure 3:
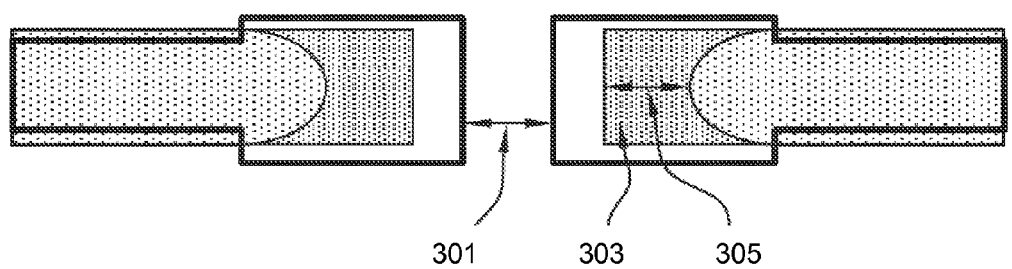
FIG. 3 illustrates an example of an MRC limit causing a printing error.

Another cause of potential print errors is mask rule constraint (MRC) limited edge movement. OPC recipes typically utilize user-defined controls to limit unmanageable reticle shapes. Such limitations (or other user supplied constraints) can prevent needed corrections from being made during an OPC process. FIG. 3 illustrates an example of an MRC limit inducing a printing problem. In FIG. 3, the minimum allowed mask space limit 301 prevents the OPC program from moving the line-end 303, and preventing the excessive pullback printing error 305.

Figure 4:
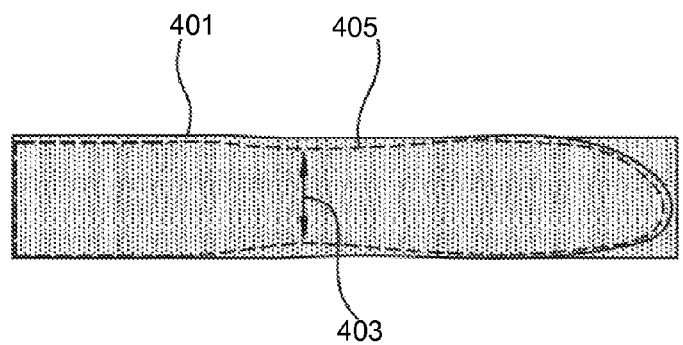
FIG. 4 illustrates an example of a soft pinching failure at defocus.
Figure 5:
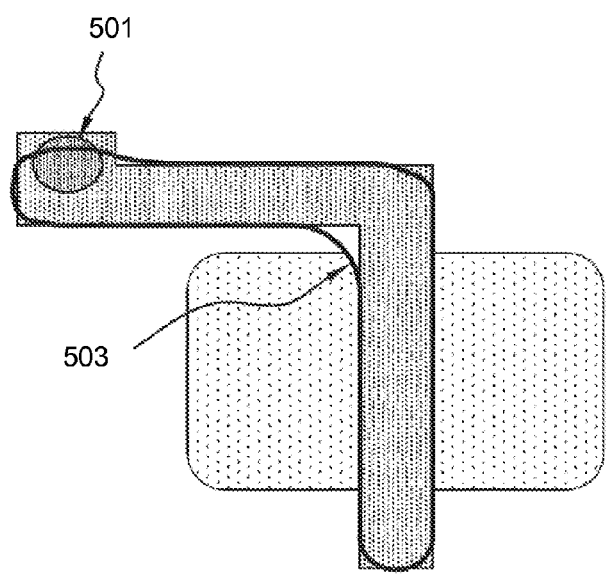
FIG. 5 illustrates an example of two design intent failures.

Having edge fragments in a sub-optimal location can also cause a potential print error. As mentioned previously, design edges are subdivided into smaller edges known as fragments. These fragments are moved to achieve the desired OPC objective function. However, if the fragment locations are not ideal for realizing the objective, a failure can result. Yet another cause of potential print errors is process corner failure. If the final OPC layout data is verified at multiple focus and dose conditions, it is possible to have no defect locations at the nominal conditions, while failures exist at a process corner condition. This is shown graphically in FIG. 4. The nominal focus 401 shows no printing errors. However, a soft-pinching error 403 is manifest at defocus 405, after OPC is complete. Additionally, potential print errors can be caused by what is known as a design-intent failure. This is a condition where a simulated image may show no failure indicating printing errors, and yet the simulated result still fails to satisfy the intent of the designer. FIG. 5 shows two examples of design intent failures. In one case, the polysilicon coverage of the contact is insufficient 501. In the second case the gate length is too large, due to corner rounding 503.

Figure 6A:
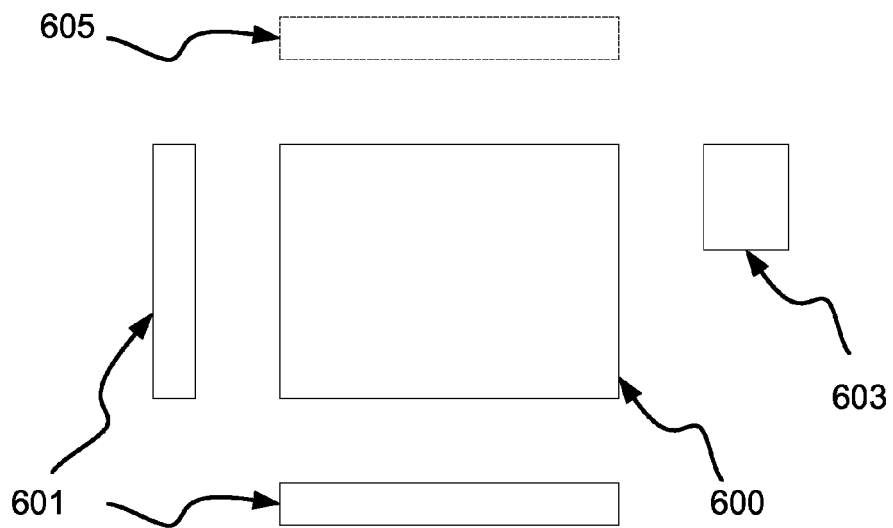
FIG. 6a illustrates an example of SRAF problem.
Figure 6B:
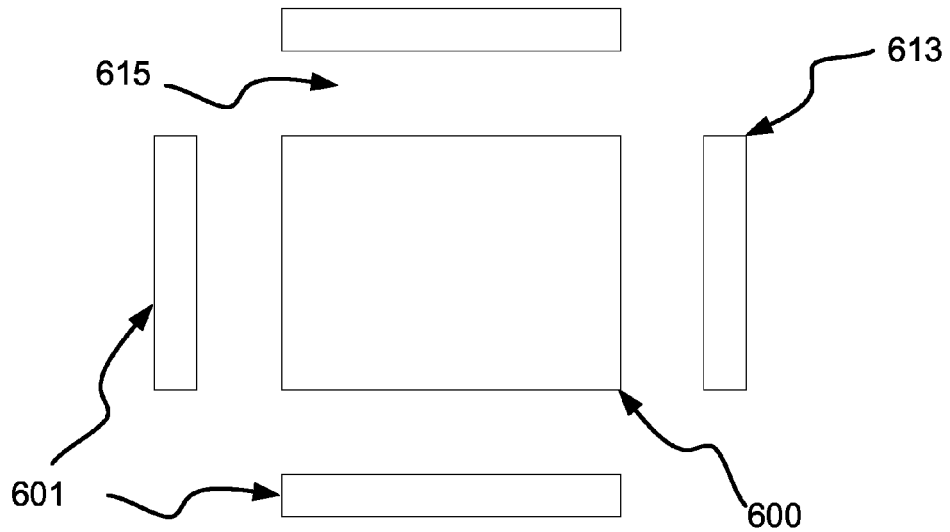
FIG. 6b illustrates properly placed SRAFs.

SRAFs are usually added during a resolution enhancement process. Problems related to the added SRAFs can also lead to print errors. FIG. 6a illustrates an example of SRAF problems and FIG. 6b illustrates properly placed SRAFs. In both figures, the rectangular shape 600 represents a main feature while the rest features are SRAFs. Comparison of the two figures shows that in FIG. 6a, while the SRAFs 601 are properly placed, the SRAF 615 is missing (represented by the feature 605) and the SRAF 613 is replaced with the SRAF 603. The missing and misplaced SRAFs can affect how the main feature 600 is printed. SRAF-related problems such as the missing 605 and the misplaced 603 may be caused by a defective SRAF tool or by problems associated with or generated by other tools such as a traditional OPC tool.

Iterative OPC Repair

The list of failure modes given in the previous section hints at the difficulty of finding a single, globally applicable set of OPC process parameter values, which would correct all potential print failures in every situation. To solve this problem, an iterative repair flow, for correcting potential print failures in layout design data is disclosed.

Figure 7:
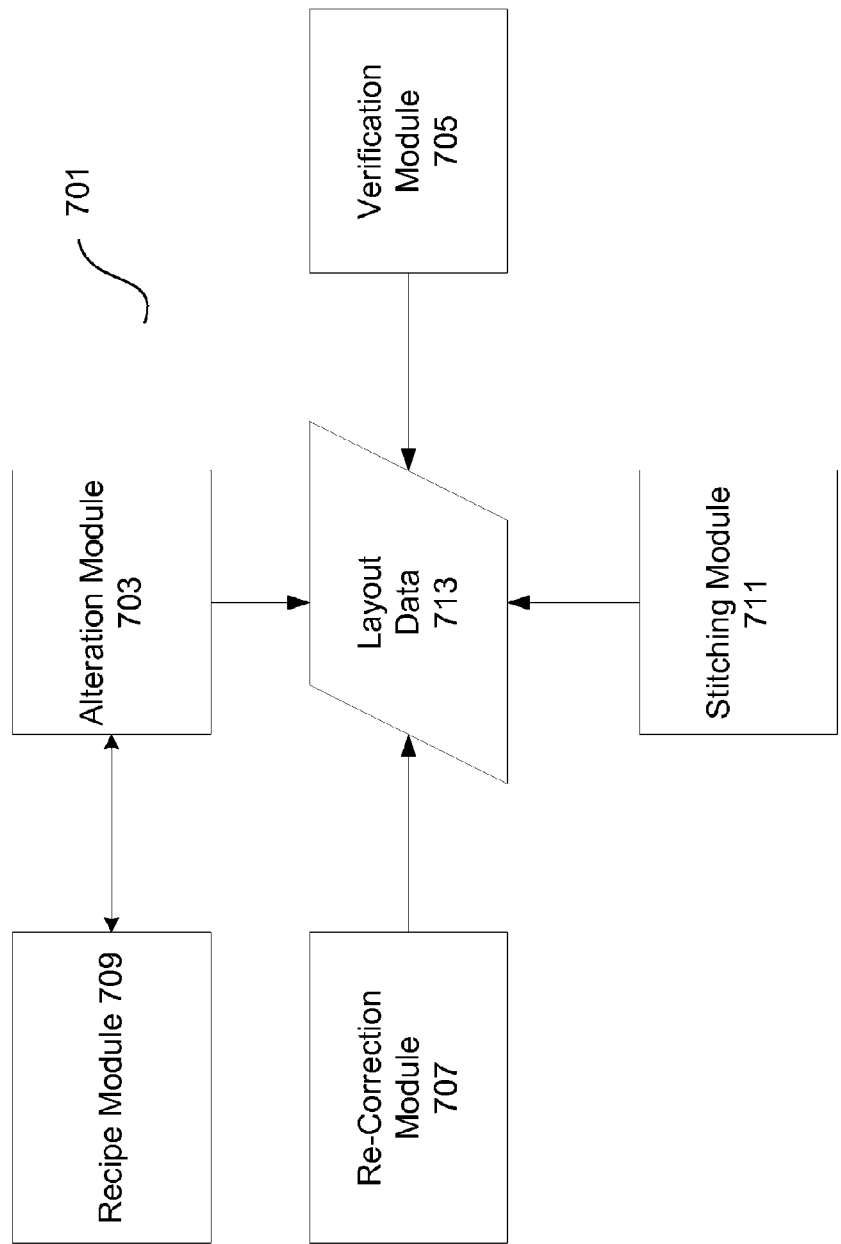
FIG. 7 illustrates a repair tool according to various implementations of the invention.

FIG. 7 illustrates an example of a repair tool 701 that may be implemented according to various embodiments of the invention. As seen in this figure, the tool 701 includes an alteration module 703, a verification module 705, a re-correction module 707, recipe module 709, and a stitching module 711. A resolution enhancement process including an OPC process is applied on layout design data 713 by alteration module 703. The alteration module 703 performs an OPC process on the layout design data 713 using a set of OPC process parameters. The altered data is then checked for errors by the verification module 705. Re-correction module 707 then designates a portion of the layout data around a detected error as a re-correction region. The recipe module 709 creates a second set of parameter values. The alteration module 703 then alters the data designated by the re-correction region using the second set of parameter values.

With various implementations of the invention, the repair tool 701 can be used to correct multiple errors in a layout design. With these implementations, for each error detected by the verification module 705, the re-correction module 707 creates a separate re-correction region around the detected error. The alteration module 703 then modifies the layout data within the designated re-correction regions using a set of parameter values specified by the recipe module 709. Alternatively, in still other implementations of the invention, the re-correction module 707 creates re-correction regions which include more than one error detected by the verification module 705. In still other implementations of the invention, the alteration module 703 may use a different set of parameter values specified by the recipe module 709 to alter each re-correction region formed by re-correction module 707.

Figure 8:
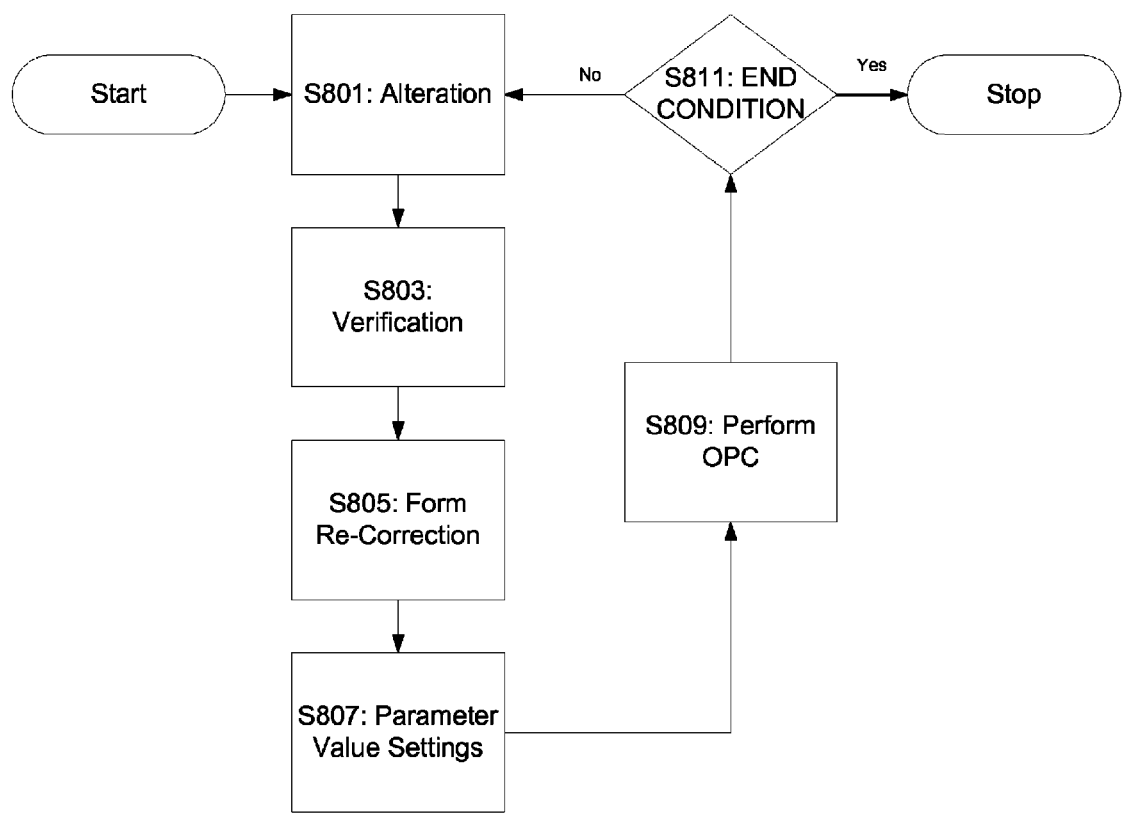
FIG. 8 illustrates a flow chart describing an iterative OPC repair method according to various implementation of the invention.

The implementation of the embodiment described by FIG. 7 can be performed iteratively using tool 701, as described by the flow chart shown in FIG. 8. As seen in this figure, in step 801 the alteration module 703 alters the layout design data by performing an OPC process on the layout design data 713 using a first set of parameter values. The altered data is then checked for errors by the verification module 705 in S803. In S805, the re-correction module 707 forms a re-correction region around a detected error. Then, in S807, a second set of parameter values are created by recipe module 709. This second set of parameter values is used by the alteration module 703 to perform an OPC process on the portion of the layout design data 713 designated by the re-correction region in S809. Steps 803 through 809 can be repeated until an end condition is satisfied, as described by S811.

The end condition described by S811 can be that a set number of iterations have been performed, that no errors were detected by the verification module 703, that a specified amount of time has been exceeded, or that a specified number of changes have been made to the layout design data, or any another desired end condition.

With various implementations of the invention, different iterations of the OPC process will employ different sets of process parameter values. For example, in step S801 the alteration module 703 performs a first OPC process using a first set of parameter values, and in step S809 the alteration module 703 performs a second OPC process using a second set of parameter values. In various implementations of the invention, the second set of parameter values is created by changing the value of parameter from value the value included in the first set of parameter values. With still other implementations of the invention, the second set of parameter values is created by using at least one different parameter from those used within the first set of parameter values.

In still other examples of the invention, the alteration module 703 may perform use the same OPC process technique for the initial OPC process and subsequent OPC processes. With still other implementations of the invention, however, the alteration module 703 may use different OPC process techniques for the initial OPC process and one or more of the subsequent OPC processes, and/or employ different OPC process techniques for subsequent OPC processes. For example, the alteration module 703 may employ an OPC process technique based upon one type of OPC algorithm for the initial OPC process, and use another OPC process technique based upon a second, different type of OPC algorithm for the subsequent OPC processes.

Figure 9:
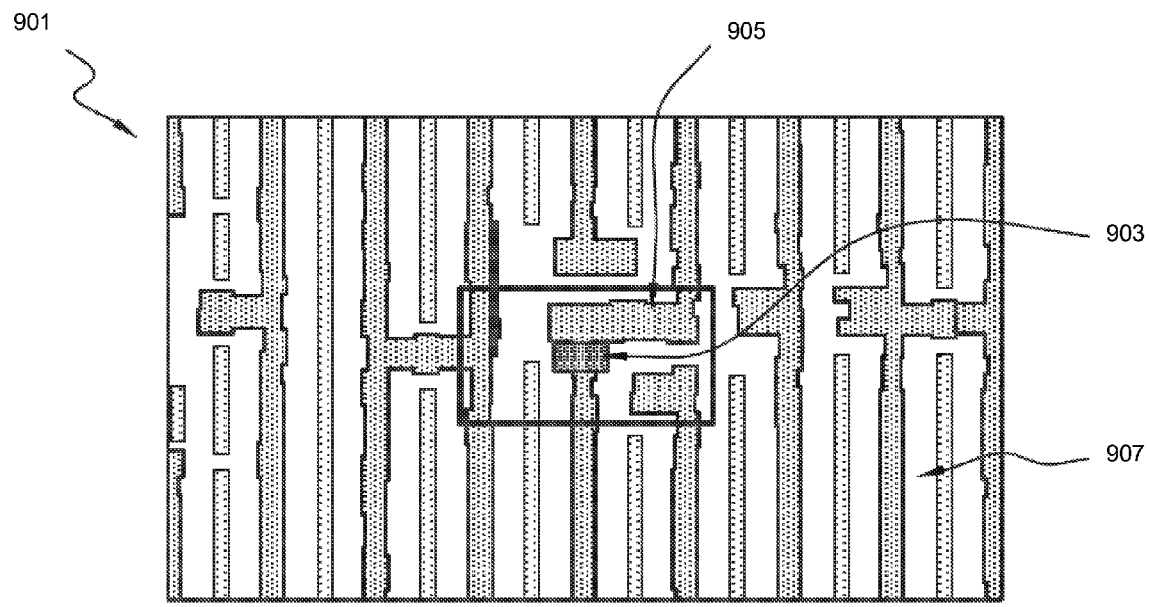
FIG. 9 illustrates an example of a layout design region that includes an error marker, a re-correction region and a context region.

In still another implementations of the invention, the re-correction module 707, forms a context region in addition to the re-correction region. More particularly, as shown in FIG. 9, the context region designates a second portion of the layout design data encompassing a corresponding re-correction region as a context region. As seen in this figure, the layout data 901 includes an error 903. As also seen in this figure, a re-correction region 905 has been formed around error 903 by the re-correction module 707, and a context region 907 has also been formed around the re-correction region 905 by the re-correction module 707. With various embodiments of the invention, the alteration process performed in S809, while only altering data designated by the re-correction region 905, is performed based upon the data designated by context region 907. That is, the OPC process is performed on edge fragments within the re-correction region 905 taking into account the position of and corresponding constraints imposed by edge fragments outside of the re-correction regions but within the surrounding context region 907. Those of skill in the art will appreciate that although in this implementation, re-correction module 707 is forming both re-correction region 905 and context region 907, this task could also be performed by separate modules.

With various examples of the invention, a re-correction region 905 is formed by overlaying a specified geometric shape over an error detected by verification module 705. The perimeter of the specified geometric shape then defines the boundary for the re-correction region. Similarly, a context region 907 may be formed by overlaying a larger specified geometric shape over an error detected by verification module 705, or over a previously-formed re-correction region 905. The perimeter of the specified geometric shape then defines the boundary for the context region. With various examples of the invention, the geometric shape used for defining the context regions may be the same as the geometric shape used for defining the re-correction regions, only larger. For example, a square shape may be used to define both the re-correction regions and the context regions. For still other examples of the invention, however, the geometric shape used for defining the context regions may be different from the geometric shape used for defining the re-correction regions.

With still other implementations of the invention, the re-correction region 905 and the context regions 907 may be formed by creating the boundaries a specified distance from the fragments contributing to the error. It also should be noted that, with various examples of the invention, the size of the re-correction region 905 formed around a detected error, the size of the context region 907 formed around a detected error, or both may increase or decrease with each subsequent iteration of the OPC process using a different set of parameter values.

Additionally, various implementations of the invention may restrict the edge fragments that can be moved by an OPC process to only those fragments located entirely within the re-correction region 905. In other implementations, however, the OPC process may be permitted to move those fragments which extend into or touch the re-correction region 905 boundary in addition to the fragments entirely enclosed by the re-correction region 905. Similarly, with various examples of the invention, the OPC process may take into account only those edge fragments located entirely within the context region 907. In still other implementations, however, the OPC process may account for those fragments which extend into or touch the boundary of the context region 907.

As will be appreciated by those of ordinary skill in the art, a number of different process parameters can be employed in an OPC process, and the choice of these parameters, as well as the value associated with each parameter, can vary. The following is provided as an example of some of the process parameters typically employed by those of ordinary skill in the art: fragment size, location, and spacing constraints; feedback factors, which, when applied, act as dampening factors within the alteration process carried out by alteration module 703; weighting factors for one or more of the other process parameters; and the number of simulation iterations performed by the OPC process. These are just a few examples of known OPC process parameters, but still other parameters are known to those of ordinary skill in the art and can be employed with various embodiments of the invention. The parameters and parameter values created by recipe module 709 can vary according to any known criteria, including, for example, user defined preferences, design constraints, photolithography or fabrication tool constraints, and/or prior learning or knowledge about the OPC process and design layout.

Stitching Re-Correction Regions into the Layout

Figure 10:
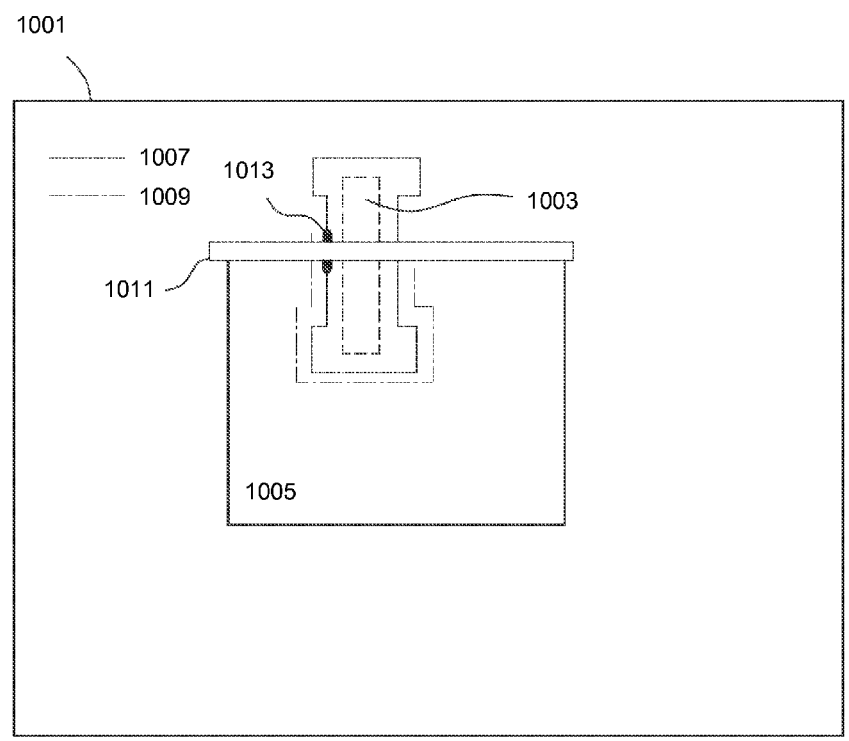
FIG. 10 illustrates an example of a layout feature of which two parts need to be stitched together.

Once the repair flow has completed (e.g., no errors are detected by verification module 705 or the end condition has been otherwise satisfied in step S811), the layout design data may contain sections that have been modified by multiple OPC processes, as shown in FIG. 10. As seen in this figure, the layout data 1001 includes polygon edges 1007 and polygon edges 1009 that were created during OPC processes from an initial polygon shape 1003. As discussed in detail above, however, the polygon edges 1009 are arranged by an OPC process that is subsequent to the OPC process in which the edges 1007 are arranged. Accordingly, the polygon edges 1007 may not be aligned with the polygon edges 1009 at the boundary of the re-correction region 1005. This has the potential to causes a "jog" problem at the boundary, which could cause an additional print error.

To address this potential discrepancy, with various implementations of the invention the OPC tool 701 may also include a stitching module 711. The stitching module 711 "stitches" the layout design data modified by a subsequent OPC process into an earlier version of the layout design data so that the edge fragments at the boundary line up sufficiently to prevent additional potential print errors.

More particularly, the stitching module 711 matches an edge fragment at one side of the boundary of the re-correction region with the corresponding fragment on the opposite side of the boundary of the re-correction region, and then moves the fragments into alignment. With various examples of the invention, the stitching module 711 forms a stitching band 1011 around the subsequent OPC 1009 layout data as shown in FIG. 10. The stitching band 1011 is sufficiently broad to overlap both the edge fragments 1009 proximal to one side of the re-correction region boundary and edge fragment 1007 proximal to the opposite side of the re-correction region boundary. A typical stitching band may be, for example, 100 nm in width, but can varied as necessary to ensure alignment between edge fragments on either side of the re-correction region boundary. For a target fragment falling within the stitching band 1011 (e.g., edge fragment 1013), all fragments within a specified distance from the target fragment are identified, and an identified fragment with the same orientation as the target fragment is selected. (Typically, conventional design constraints will prevent more than one fragment from being selected for alignment with the target fragment.) These fragments are then aligned by stitching module 711 to remove the potential print errors created by a "jog" at the boundary.

Sub-Resolution Assist Features Repair

Figure 11:
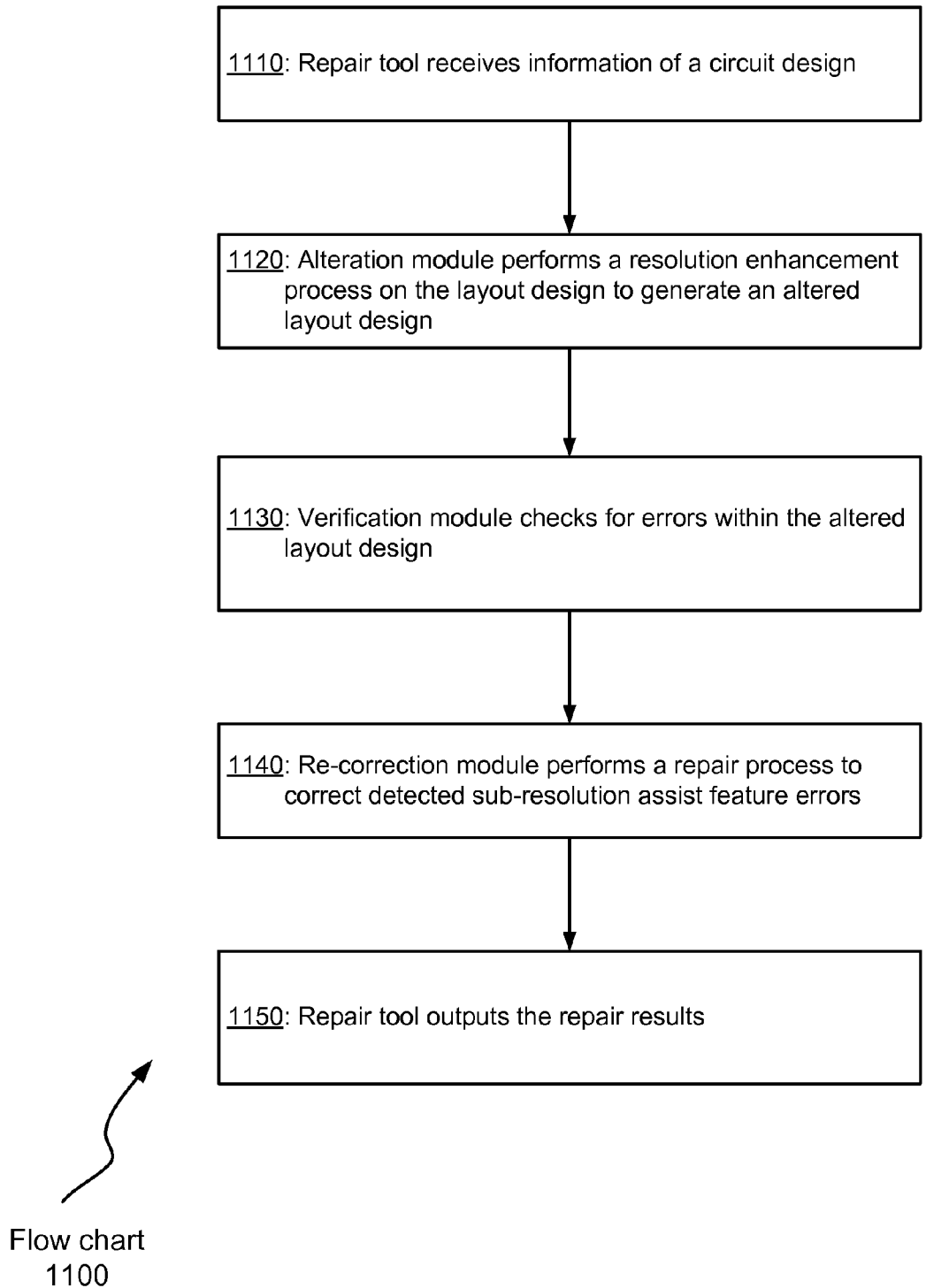
FIG. 11 illustrates a flow chart describing a SRAF repair method according to various implementation of the invention.

As discussed previously, SRAF-related problems can also lead to print errors of main features. The repair tool 701 can be used to perform a SRAF repair process. FIG. 11 illustrates an example of a flow chart describing methods for SRAF repair that may be employed by the repair toll 701 according to various embodiments of the invention. It should be appreciated, however, that alternate implementations of a repair tool may be used to perform the SRAF methods illustrated by the flow chart 1100 according to various embodiments of the invention. Likewise, the repair tool 701 may be employed to perform other SRAF repair methods according to various embodiments of the invention.

Initially, in operation 1110 of the flowchart 1100, the repair tool 701 receives information of a circuit design. The circuit design represents at least a portion of an integrated circuit design.

Next, in operation 1120, the alteration module 703 performs a resolution enhancement process on the layout design to generate an altered layout design. The resolution enhancement process comprises a SRAF insertion process. The resolution enhancement process may also comprise a conventional OPC process. To perform these processes, the alteration module 703 may adopt commercially available SRAF insertion and OPC tools such as those included in the CALIBRE family of software tools available from Mentor Graphics Corporation, Wilsonville, Oreg.

Next, in operation 1130, the verification module 705 checks the altered layout design for errors. One or more errors may be detected. The one or more errors comprise one or more SRAF errors. The one or more errors may also comprise main feature errors.

Next, in operation 1150, the re-correction module 707 performs a repair process to correct the one or more detected SRAF errors. With various implementations of the invention, the re-correction module 707 may employ a rule-based SRAF technique, a model-based SRAF technique, an inverse lithography-based SRAF technique, or any combination thereof. The re-correction module 707 may adopt commercially available rule-based and model-based SRAF insertion tools such as those included in the CALIBRE family of software tools available from Mentor Graphics Corporation, Wilsonville, Oreg. If needed, the SRAF rules and models employed by these tools may be developed or modified for the repair process.

In addition to the rule-based and model-based techniques, inverse lithography may also be used for SRAF repair. The shape and positions of SRAFs for a main feature can be determined by running an inverse lithography process on the main feature and its neighboring features. The inverse lithography treats the proximity correction problem as a constrained optimization problem. The main objective G is a functional that expresses a deviation of the image I(x,y) from the threshold constant T along the target contours $C_i$ of the frame:

$$G = \sum_i \oint_{C_i} (I(\xi, \eta) - T)^2 dl \to \min \qquad (1)$$

Here $\zeta=\zeta$ (l) and $\eta=\eta$ (l) are Cartesian coordinates along the target contours; dl represents a contour integration element. The image I(x,y) is controlled by the mask, thus the main functional G depends on the mask transmission m=m(x,y), a complex-valued piece-wise constant function. Thus the constrained optimization problem may be stated as finding the mask m=m(x,y) that minimizes $$G[m] \to \min, \qquad (2)$$

while constraining acceptable values of the mask transmission function to the constants $m_{min}$ and 1. For chrome masks $m_{min}=0$. For OMOG masks $m_{min}$ is a complex constant $m_{min} \approx (0.023, -0.022)$. The inverse lithography tries to find an analytical representation of the gradient of the objective, and then may use fast Fourier transformation to quickly calculate it.

The analytical expression for the gradient of the objective can be found by perturbing the mask m→m+δm and then finding the linear part of the perturbation of the objective δG. In the case of the objective (1), the following analytical expression for the gradient may be obtained:

$$g(x, y) = 4 \operatorname{Re} \sum_{k=1}^{N} \lambda_k \sum_i \int_{C_i} (I(\zeta, \eta) - T) A_k^*(\xi, \eta) K_k(\xi - x, \eta - y) dl \qquad (3)$$

$$I(x, y) = \sum_{k=1}^{N} \lambda_k A_k^*(x, y) A_k(x, y)$$

$$A_k = K_k(x, y) \otimes m(x, y)$$

where N is the total number of optical kernels, $\lambda_n$ are weights of the optical kernels, $A_n$ is the electrical field from the n-th kernel $K_n$. The discretized version of (3) can be quickly calculated through fast Fourier transformations.

The gradient g(x,y) of the objective is used in the iterative procedure to move mask contours or to modify mask transmissions in a manner that reduced the value of the objective function G. This process automatically inserts SRAFs, which can be used for the SRAF repair.

If main feature errors are also detected by the verification module 705, the re-correction module 707 can perform a repair process to correct the detected main feature errors using the methods discussed in the previous sections.

Lastly, in operation 1150, the repair tool 701 outputs repair results. For example, the corrected layout design may be saved to a memory storage location.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. One or more non-transitory computer-readable media storing computer-executable instructions for causing one or more processors to perform a method, the method comprising:
    receiving information of a layout design, the layout design representing at least a portion of an integrated circuit design;
    performing a resolution enhancement process on the layout design to generate an altered layout design;
    checking the altered layout design for errors, wherein one or more errors are detected and comprise one or more sub-resolution assist feature errors and one or more main feature errors;
    performing a repair process to correct the one or more detected sub-resolution assist feature errors;
    saving the corrected layout design to a memory storage location;
    A. forming a re-correction region around at least one of the one or more main feature errors, wherein the re-correction region designates a sub-portion of the altered layout design;
    B. identifying a second set of parameter values different than the first set of parameter values employed by the resolution enhancement process;
    C. performing an optical proximity correction process that employs the second set of parameter values on the re-correction region to generate an altered re-correction region; and
    D. stitching the altered re-correction region into the altered layout design to generate a modified layout design.

2. The one or more non-transitory computer-readable media recited in claim 1, wherein the method further comprises iterating the checking for errors and method acts A through C until an end condition is met, wherein a plurality of altered sub-portions of the layout design are generated, and wherein method act D stitches the plurality of altered sub-portions of the layout design into the altered layout design.

3. The one or more non-transitory computer-readable media recited in claim 1, wherein the second set of parameter values has at least one different parameter than the first set of parameter values does.

4. The one or more non-transitory computer-readable media recited in claim 1, wherein method act A further comprises: forming a context region, the context region encompassing the re-correction region and designating a second sub-portion of the layout design; the optical proximity correction process implemented by method act C takes as input the second sub-portion of the layout design designated by the context region; and the optical proximity correction process implemented by method act C only alters the sub-portion of the layout design designated by the re-correction region.

5. The one or more non-transitory computer-readable media recited in claim 1, wherein the method further comprises iterating the checking for errors and method acts A through C until an end condition is met.

6. A method, comprising:
    with a computer,
    receiving information of a layout design, the layout design representing at least a portion of an integrated circuit design;
    performing a resolution enhancement process on the layout design to generate an altered layout design;
    checking the altered layout design for errors, wherein one or more errors are detected and comprise one or more sub-resolution assist feature errors and one or more main feature errors;

performing a repair process to correct the one or more detected sub-resolution assist feature errors;

saving the corrected layout design to a memory storage location; and

A. forming a re-correction region around at least one of the one or more main feature errors, wherein the re-correction region designates a sub-portion of the altered layout design;

B. identifying a second set of parameter values different than the first set of parameter values employed by the resolution enhancement process;

C. performing an optical proximity correction process that employs the second set of parameter values on the re-correction region to generate an altered re-correction region; and D. stitching the altered re-correction region into the altered layout design to generate a modified layout design.

7. The method recited in claim 6, wherein the method further comprises iterating the checking for errors and method acts A through C until an end condition is met, wherein a plurality of altered sub-portions of the layout design are generated, and wherein method act D stitches the plurality of altered sub-portions of the layout design into the altered layout design.

8. The method recited in claim 6, wherein the second set of parameter values has at least one different parameter than the first set of parameter values does.

9. The method recited in claim 6, wherein method act A further comprises: forming a context region, the context region encompassing the re-correction region and designating a second sub-portion of the layout design; the optical proximity correction process implemented by method act C takes as input the second sub-portion of the layout design designated by the context region; and the optical proximity correction process implemented by method act C only alters the sub-portion of the layout design designated by the re-correction region.

10. The method recited in claim 6, wherein the method further comprises iterating the checking for errors and method acts A through C until an end condition is met.

\* \* \* \* \*